United States Patent [19]
Acocella et al.

[11] Patent Number: 5,167,913
[45] Date of Patent: Dec. 1, 1992

[54] METHOD OF FORMING AN ADHERENT LAYER OF METALLURGY ON A CERAMIC SUBSTRATE

[75] Inventors: John Acocella, Hopewell Junction; Philip L. Flaitz, Walden; Raj N. Master, Wappingers Falls; Chandrasekhar Narayan; Sarah H. Knickerbocker, both of Hopewell Junction; Paul H. Palmateer, Wappingers Falls; Sampath Purushothaman, Yorktown Heights; Srinivasa S. N. Reddy, LaGrangeville, all of N.Y.

[73] Assignee: International Business Machines Corp., Armonk, N.Y.

[21] Appl. No.: 813,244

[22] Filed: Dec. 23, 1991

[51] Int. Cl.⁵ .................................................. B22F 7/00
[52] U.S. Cl. ...................... 419/7; 228/263.18; 228/123; 419/9; 419/10; 419/19; 419/36; 419/57; 427/71; 427/123; 427/191; 427/287; 427/376.7; 428/620; 428/632; 428/469
[58] Field of Search ............ 419/7, 9, 10, 19, 36, 419/57; 427/71, 191, 123, 376.7, 287; 428/620, 632, 469; 228/263.18, 123

[56] References Cited

U.S. PATENT DOCUMENTS

| | | | |
|---|---|---|---|
| 3,854,957 | 12/1974 | Larry | 106/1 |
| 4,050,956 | 9/1977 | deBruin et al. | 148/6 |
| 4,301,324 | 11/1981 | Kumar et al. | 174/68.5 |
| 4,604,299 | 8/1986 | De Luca | 427/98 |
| 4,627,160 | 12/1986 | Herron et al. | 29/830 |
| 4,631,099 | 12/1986 | Ebata et al. | 156/89 |
| 4,764,341 | 8/1988 | Flaitz et al. | 419/9 |
| 4,863,683 | 9/1989 | Nakatani et al. | 419/10 |
| 5,058,799 | 10/1991 | Zsamboky | 427/98 |
| 5,100,714 | 3/1992 | Zsamboky | 428/632 |

Primary Examiner—Stephen J. Lechert, Jr.

[57] ABSTRACT

A method of forming an adherent layer of metallurgy on a ceramic substrate which includes the steps of obtaining a ceramic material containing a polymeric binder and copper metallurgy patterns within the ceramic body. In one embodiment of the invention, the ceramic body also contains MgO.

Thereafter, a surface layer of metallurgy is formed on the surface of the ceramic body. In one embodiment, the surface layer is nickel and in another embodiment, the surface layer is copper or gold.

Then, the ceramic body undergoes a sintering cycle which includes the steps of pyrolysis, binder burnoff and, lastly, densification and, in some cases, crystallization. During densification and crystallization, there is a predetermined steam atmosphere which meets the following requirements: a partial pressure of oxygen less than that necessary to satisfy the equilibrium equation $4Cu + O_2 = 2Cu_2O$; and a partial pressure of oxygen less than or equal to that necessary to satisfy the equilibrium equation $2Ni + O_2 = 2NiO$ for nickel in said surface metallurgy.

25 Claims, 2 Drawing Sheets

METHOD OF FORMING AN ADHERENT LAYER OF METALLURGY ON A CERAMIC SUBSTRATE

BACKGROUND OF THE INVENTION

The present invention relates to the field of co-fired glass and/or ceramic (hereafter just ceramic) structures and, more particularly, to techniques for processing such structures so as to be able to form adherent layers of metallurgy on their surface.

Ceramic structures, usually and preferably multilayered, are used in the production of electronic substrates and devices. Many different types of structures can be used, and a few of these structures are described below. For example, a multilayered ceramic circuit substrate may comprise patterned metal layers which act as electrical conductors sandwiched between ceramic layers which act as insulators. The substrates may be designed with termination pads for attaching semiconductor chips, connector leads, capacitors, resistors, covers, etc. Interconnection between buried conductor levels can be achieved through vias formed by metal paste-filled holes in the individual glass ceramic layers formed prior to lamination, which, upon sintering, will become a sintered dense metal interconnection of metal-based conductor.

In general, conventional ceramic structures are formed from ceramic greensheets which are prepared by mixing a ceramic particulate, a catalyst (e.g., such as that disclosed in Herron, et al., U.S. Pat. No. 4,627,160), a thermoplastic polymeric binder, plasticizers and solvents. This composition is spread or cast into ceramic sheets or slips from which the solvents are subsequently volatilized to provide coherent and self-supporting flexible green sheets. After blanking, stacking and laminating, the green sheets are eventually fired at temperatures sufficient to drive off the polymeric binder resin and sinter the ceramic particulates together into a densified ceramic substrate.

The electrical conductors used in formation of the electronic substrate may be high melting point metals such as molybdenum and tungsten or a noble metal such as gold. However, it is more desirable to use a conductor having a low electrical resistance and low cost, such as copper and alloys thereof.

Use of copper-based conductors in the multilayered structures requires the use of process techniques which do not oxidize the copper during the removal of binder resins and solvents, and sintering of the ceramic particulates together into the densified ceramic substrate.

For example, a typical firing cycle consists of pyrolyzing the binder, burning the binder off in a steam ambient, typically water vapor plus hydrogen, and then replacing the steam ambient with an inert (neutral) ambient such as nitrogen and sintering the structure to its final densified state, followed by a cool down, again in an inert atmosphere such as nitrogen.

This seemingly simple firing cycle is, in fact, extraordinarily complex in nature and has taken years and large expense to achieve. It is not an understatement to say that improvements in this art come in small steps rather than in great leaps.

It would be desirable to be able to bond a copper or gold layer to the surface of the ceramic structure. Such a metal layer might serve as a capture pad, bonding pad, input/output (I/O) pad, wiring line or other use. A pervasive problem, however, is the bonding of this metal layer to the ceramic structure without oxidizing the copper patterns. Copper and gold are notoriously deficient in adhering to ceramic structures under these kinds of sintering conditions. Obviously, an insufficiently bonded metal layer would suffer delamination during the bonding process or in use.

The art is replete with numerous metallurgies and techniques utilized to achieve an adherent metal layer on a ceramic surface.

Flaitz et al. U.S. Pat. No. 4,764,341 discloses the bonding of, for example, a nickel layer to an oxide ceramic by interposing a ternary oxide of the metal to be joined which, for this example, is $NiAl_2O_4$. The firing cycle is adjusted so that the nickel layer does not form nickel oxide and yet it is sufficiently oxidative to ensure the removal of carbon residue from the polymeric binder. The end result is nickel bonded to the $NiAl_2O_4$ which, in turn, is bonded to the oxide ceramic.

Chance et al. U.S. patent application Ser. No. 929975, filed Nov. 12, 1986, "Method For Producing High Density Multilayered Glass-Ceramic Structures With Metallic Based Conductors", now abandoned but published in Japan on May 12, 1988, as J89050120-B, discloses the bonding of nickel pads to a glass-ceramic material during the firing cycle. A key element of the process is the oxidizing of the nickel pad during the crystallization segment of the firing cycle. The NiO film causes the nickel pad to bond to the glass-ceramic material. Thereafter, the NiO film may be removed by chemical means or by a reducing ambient. This latter process step, however, risks reducing the NiO bonds the nickel pad to the glass-ceramic material with the consequence that delamination of the nickel pads may occur.

Nakatani et al. U.S. Pat. No. 4,863,683 discloses a glass-ceramic substrate having an oxide paste, e.g., NiO, which during the firing cycle is reduced to the base metal, nickel in this case. The remainder of the firing cycle is completed without oxidizing the base metal.

deBruin et al. U.S. Pat. No. 4,050,956 discloses the bonding of certain metals, including copper, nickel and gold, to a refractory oxide ceramic wherein the metal and ceramic are placed in an abutting relationship and then fired in air. Ebata et al. U.S. Pat. No. 4,631,099 similarly discloses joining copper or a copper alloy to an oxide ceramic by placing them in abutting contact and then firing in an oxidative atmosphere.

Larry U.S. Pat. No. 3,854,957 discloses a metallizing paste consisting of noble metals and NiO applied to a ceramic substrate. The firing atmosphere is not specified. The NiO is added to increase the adhesion of the paste to the ceramic substrate.

The disclosure of all of the previous references are incorporated by reference herein.

Notwithstanding the prior art, there still remains a need to bond a metal layer to a ceramic structure under conditions which are non-oxidizing to the copper patterns in the ceramic structure.

Accordingly, it is an object of the invention to form an adherent layer of metal on a ceramic structure without causing oxidation of the internal copper patterns.

It is another object of the invention to form a copper, nickel or gold layer on the surface of a ceramic structure without causing oxidation of the internal copper patterns.

It is yet another object of the present invention to form such a copper, nickel or gold layer which is adherent and will not delaminate during bonding processes or in use.

BRIEF SUMMARY OF THE INVENTION

These and other objects of the invention have been achieved by providing, according to one aspect of the invention, a method of forming an adherent layer of metallurgy on a ceramic substrate comprising the steps of:

obtaining a green ceramic body comprising a ceramic material containing at least 5 weight percent of MgO, a polymeric binder and copper metallurgy patterns within said ceramic body;

forming a layer of nickel-containing metallurgy on said ceramic body;

sintering said ceramic body through a sintering cycle comprising the steps of:
  (a) a pyrolysis segment to pyrolyze said polymeric binder;
  (b) a binder burnoff segment conducted at a first temperature and in a steam atmosphere wherein said atmosphere is sufficient to burn off said binder without oxidizing said copper metallurgy; and
  (c) a densification and, in some cases, crystallization segment conducted at a second temperature higher than said first temperature and in a steam atmosphere, said steam atmosphere selected to meet the following requirements:
    a partial pressure of oxygen less than that necessary to satisfy the equilibrium equation $4Cu + O_2 = 2Cu_2O$; and a partial pressure of oxygen less than or equal to that necessary to satisfy the equilibrium equation $2Ni + O_2 = 2NiO$.

According to another aspect of the invention, there is provided a method of forming an adherent layer of metallurgy on a ceramic substrate comprising the steps of:

obtaining a green ceramic body comprising a ceramic material containing NiO, a polymeric binder and copper metallurgy patterns within said ceramic body;

forming a layer of surface metallurgy on said ceramic body, said surface metallurgy selected from the group consisting of copper and gold;

sintering said ceramic body through a sintering cycle comprising the steps of:
  (a) a pyrolysis segment to pyrolyze said polymeric binder;
  (b) a binder burnoff segment conducted at a first temperature and in a steam atmosphere wherein said atmosphere is sufficient to burn off said binder without oxidizing said copper metallurgy patterns; and
  (c) a densification and, in some cases, crystallization segment conducted at a second temperature higher than said first temperature and in a steam atmosphere, said steam atmosphere selected to meet the following requirements:
    a partial pressure of oxygen less than that necessary to satisfy the equilibrium equation $4Cu + O_2 = 2Cu_2O$; and a partial pressure of oxygen less than that necessary to satisfy the equilibrium equation $2Ni + O_2 = 2NiO$ for nickel in said surface metallurgy.

DETAILED DESCRIPTION OF THE INVENTION

Figure 1:
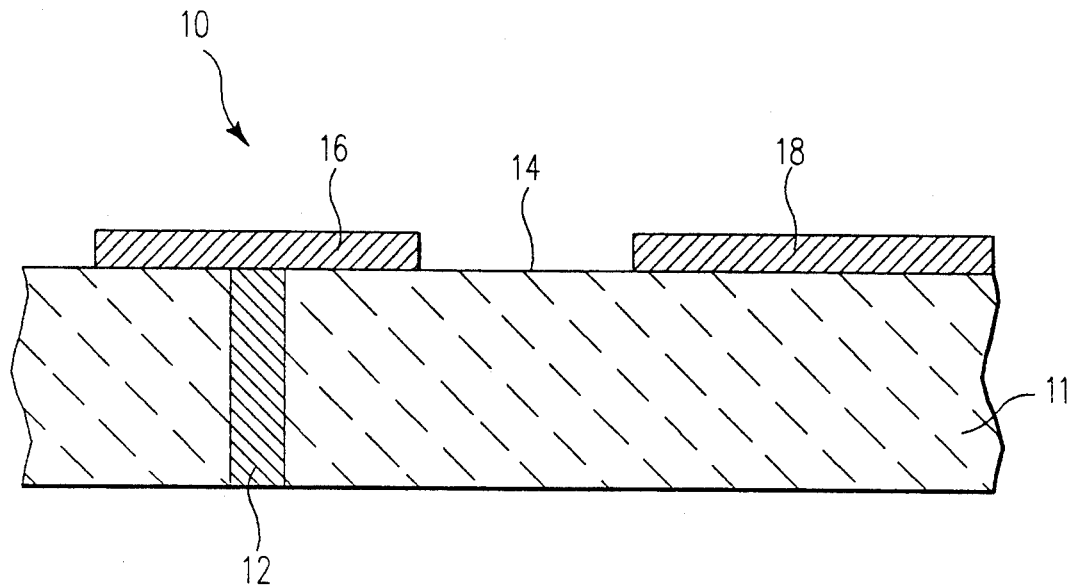
FIG. 1 is a partial cross-section of a ceramic structure having an adherent layer of nickel according to the invention.

Referring to the figures in more detail, and particularly referring to FIG. 1, there is shown a ceramic structure 10. For purposes of the present invention, it will be assumed that the ceramic structure is a dielectric substrate for electronic applications. It should be understood, however, that such a ceramic structure has uses other than that described here and that those other uses are contemplated within the scope of the present invention.

The ceramic structure 10 comprises a ceramic body 11 and may have a plurality of vias 12. The vias may be, for example, copper or gold. It is desirable to be able to bond an adherent layer of metallurgy on the surface 14 of ceramic structure 10. This adherent layer of metallurgy may be, for example, a capture pad 16 in communication with vias 12 or wiring line 18. According to a first aspect of the invention, the adherent layer of metallurgy is a nickel-containing metallurgy. It should be understood that "nickel-containing" means unalloyed nickel as well as alloys with nickel wherein nickel is not the primary constituent. Additionally, nickel oxide may be substituted for the unalloyed nickel or the nickel in the alloys. Once the adherent layer of metallurgy is formed on the ceramic structure 10, then it is an easy task to further deposit additional layers of metallurgy. Thus, once the nickel-containing adherent layer of metallurgy is formed, then copper (or any other metal of low resistivity) may be easily joined to it. The essence of the invention is getting the nickel or nickel-containing alloy to join to the surface 14 of the ceramic structure 10.

The ceramic structure 10 may be made in the following manner. According to one aspect of the invention, a green ceramic body is formed, preferably by the tape casting methods discussed previously. The ceramic material that makes up the ceramic body should contain at least about 5 weight percent of MgO. The reason for this addition of MgO will become apparent hereafter. The green ceramic body also has copper metallurgy patterns within the body. Copper, of course, is preferred because of its low resistivity. Preferred ceramic materials include the spodumene and cordierite glass ceramic materials of Kumar et al. U.S. Pat. No. 4,301,324, the disclosure of which is incorporated by reference herein. Such materials may have about 18 to 25 percent of MgO. Other ceramic materials include mullite, $Al_2O_3$+glass, borosilicate glass with MgO addition and other glass ceramics.

Thereafter, a layer of nickel-containing metallurgy is formed on the surface of the green ceramic body. Such a layer may be formed by screening a paste which includes the nickel-containing metallurgy.

Figure 4:
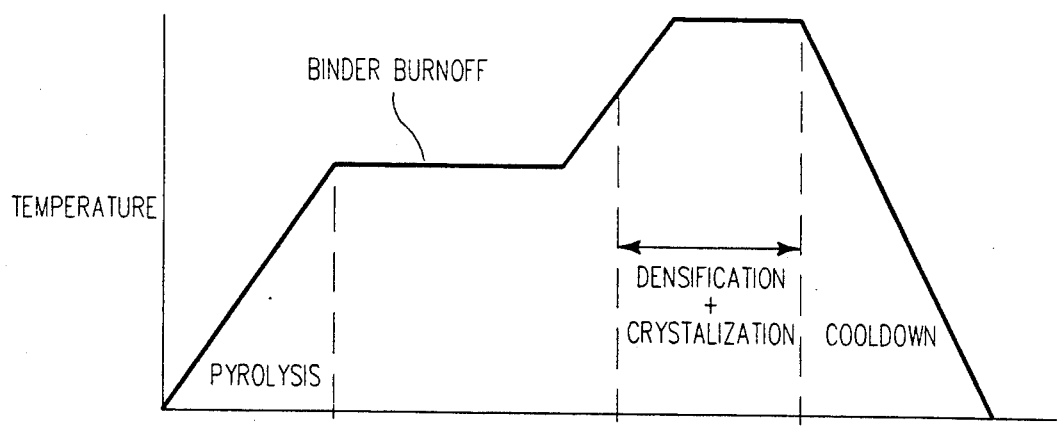
FIG. 4 is a diagram of a typical firing cycle to achieve the adherent metal layers according to the invention.

Now, the green ceramic body is sintered. Referring now to FIG. 4, the sintering cycle begins with pyrolysis which pyrolyzes the polymeric binder in the green ceramic body. The next step is binder burnoff which is conducted in a steam atmosphere. The binder burnoff is conducted in an atmosphere which is sufficient to burn off the remains of the polymeric binder without, however, oxidizing the copper metallurgy. Binder burnoff is conducted at a temperature which is less than that necessary to cause densification of the ceramic material. For the materials indicated above, the binder burnoff temperature is in the range of 690 to 850 degrees Centigrade. While generally not necessary, it is preferred to change the atmosphere after binder burnoff to nitrogen or forming gas (forming gas is a mixture of nitrogen and hydrogen). If nickel oxide is used, then forming gas must be used after binder burnoff to reduce the nickel oxide to nickel.

The invention will now be discussed with respect to FIG. 3 which illustrates the thermodynamic equilibria for the oxides of nickel and copper. Line 1 on the chart gives the equilibrium conditions for the formation of $Cu_2O$. For a given temperature and partial pressure of oxygen, $Cu_2O$ will form above this line but not below it. Line 6 gives the equilibrium condition for the burning off of carbon. Above this line, carbon will burn off as $CO_2$. Binder burnoff must take place between these two lines since above line 1, there will be detrimental oxidation of copper (which can compromise the mechanical integrity of the ceramic structure and the electrical conductivity of the copper) while below line 6, there will be insufficient burnoff of the pyrolysis products, thereby adversely affecting the electrical properties of the substrate. Kinetics dictates that binder burnoff occurs as closely as possible to the copper equilibrium line without going over it.

Figure 3:
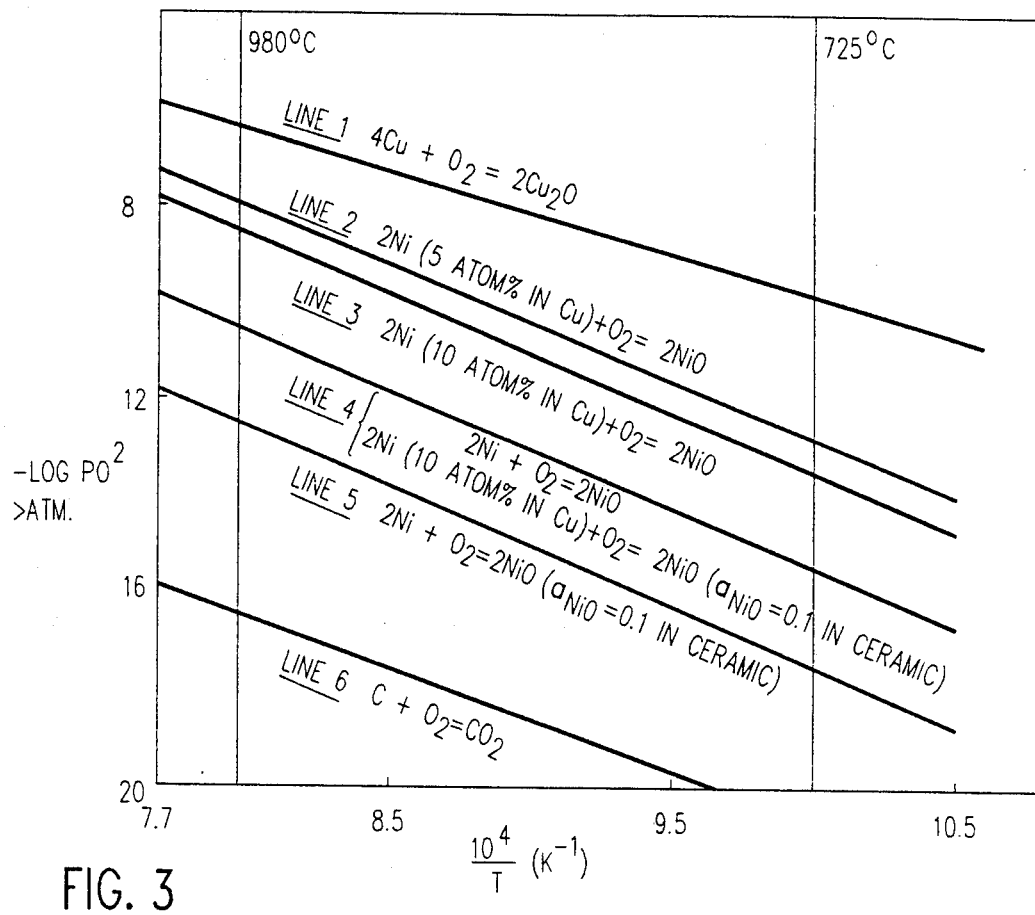
FIG. 3 is a thermodynamics chart for the reaction of nickel and copper with oxygen.

Also shown on FIG. 3 are various equilibrium conditions for the formation of nickel oxides. The equilibrium between anallloyed Ni and NiO is given by line 4. It can be seen that this line is situated between carbon oxidation and copper oxidation. To avoid nickel oxidation during binder burnoff, the partial pressure of oxygen must be below the line that describes the Ni/NiO equilibrium. If it is assumed that binder burnoff occurs below this line 4, then NiO will not form. During the optional drying step that follows, nitrogen may be used. Since nickel oxidation is not fatal at this point in the process, binder burnoff may take place above the Ni/NiO line 4 to shorten the binder burnoff time. In the subsequent drying step, forming gas may be used to reduce the NiO to nickel.

Above the Ni/NiO line for unalloyed nickel (line 4) are lines 2 and 3 that describe the equilibrium between nickel and its oxide for nickel alloyed with copper wherein there is either 5 to 10 atom percent nickel in the alloy. As is apparent from FIG. 3, the equilibrium between nickel and its oxide for a copper-nickel alloy is at a higher oxygen partial pressure than for unalloyed nickel, indicating that copper-nickel alloys may undergo binder burnoff at a higher partial pressure of oxygen without causing oxidation of the alloy.

Similar equilibria may be described for gold-nickel alloys.

It is preferred that the amount of nickel in the copper-nickel or gold-nickel alloys be limited to a maximum of 10 atom percent. Higher percentages of nickel would adversely affect the conductivity of the metallurgy. There must be a minimum of at least 1 atom percent to achieve the efficacious results of the invention.

After binder burnoff, the ceramic body next undergoes densification and, in some cases, crystallization which occurs at a higher temperature, typically in the range of 900 to 1000 degrees Centigrade for the materials indicated above. Crystallization will not always occur since some materials, such as the glass ceramics, undergo crystallization while other materials, such as alumina and glass, do not crystallize during sintering. During this segment of the firing cycle, it is essential that NiO not form. Without the formation of NiO, it would appear that there can be no forming of an adherent layer of metallurgy on the ceramic body since nickel in the metallic state does not bond to ceramic materials. The inventors have discovered, however, that when the partial pressure of oxygen and temperature are adjusted so as to be near, but below, the Ni/NiO line for unalloyed nickel (line 4) or below the Ni/NiO line for alloys containing nickel (lines 2 and 3), there is a reaction between the ceramic body and the nickel-containing metallurgy which causes the nickel-containing metallurgy to be bonded to the ceramic material.

While not wishing to be held to any particular theory, it is believed that an interfacial layer of nickel oxide solid solution forms between the surface layer of nickel-containing metallurgy and the ceramic material. This would be true whether the nickel-containing metallurgy is unalloyed nickel, a copper/nickel alloy, or a gold/nickel alloy. For example, line 5 represents the Ni/NiO equilibrium for unalloyed Ni when the NiO is dissolved in cordierite at a thermodynamic activity of 0.1 ($a_{NiO}=0.1$). Similarly, line 4 also describes equilibrium conditions for a copper/nickel alloy (10 atom percent Ni) when the NiO is dissolved in cordierite at a thermodynamic activity of 0.1 ($a_{NiO}=0.1$). As can be seen, NiO forms and dissolves in the cordierite at a lower partial pressure of oxygen than for the base metal. Accordingly, it is expected by the inventors that NiO at a reduced activity will form at the interface between the ceramic body and the nickel-containing metallurgy even though the atmospheric conditions are insufficient to oxidize the nickel-containing metallurgy to form pure NiO.

The interfacial layer then goes into solution in the ceramic material so as to bond the nickel-containing metallurgy layer to the ceramic body. The reason for this is as follows. The inventors have discovered that NiO can readily substitute for the MgO in the ceramic material. Thus, the NiO that forms at the interface goes into solution in the ceramic material. It is thus important that MgO be present in the ceramic material.

Figure 2:
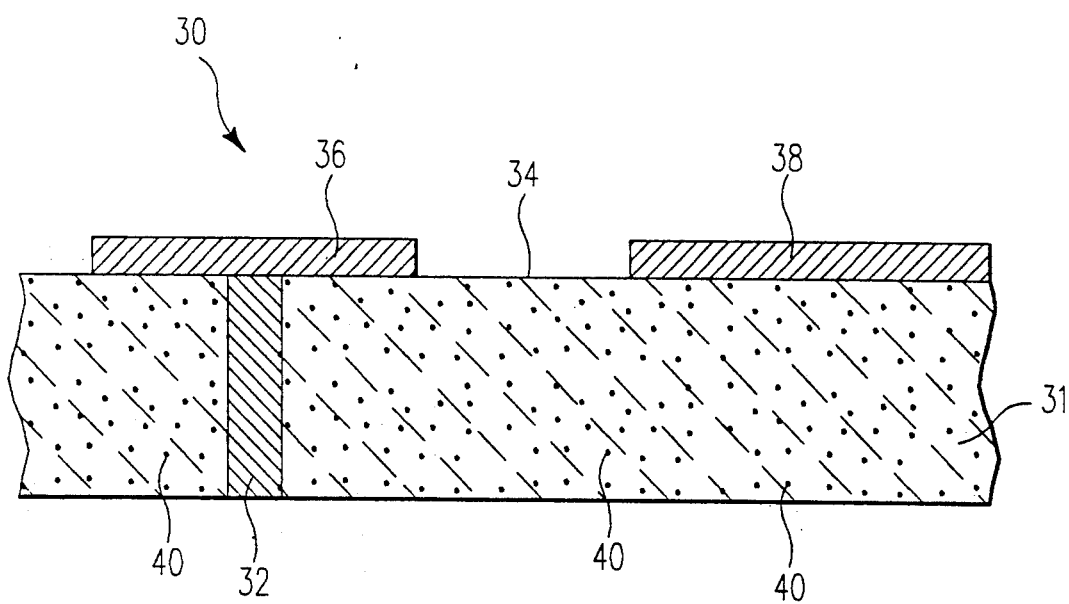
FIG. 2 is a partial cross-section of a ceramic structure having an adherent layer of copper or gold according to the invention.

Referring now to FIG. 2, the second aspect of the invention will now be discussed. As shown therein, there is a ceramic substrate generally indicated by 30 which may have a plurality of vias 32. The vias may be, for example, gold or copper. The ceramic substrate 30 includes a green ceramic body 31 having a layer of metallurgy 36, 38 formed on the surface 34 thereof. Surface metallurgy 36 may be a capture pad and surface metallurgy 38 may be a wiring line. Other forms of surface metallurgy are also contemplated within the scope of the invention.

The green ceramic body 31 comprises a ceramic material, a polymeric material and copper metallurgy patterns within the ceramic body. The green ceramic body 31 is preferably made by the tape casting method as discussed previously. The ceramic material is, preferably, the spodumene or cordierite glass ceramic materials discussed previously. While these materials normally contain some MgO, the presence of MgO is not necessary for this aspect of the invention.

The green ceramic body 31 does include, however, an addition of NiO which may be present in the ceramic material itself or may be added as discrete NiO particles to the slurry during the casting of the green sheets. (Having the NiO dispersed in the ceramic material may be also advantageous for toughening the ceramic.) As shown in FIG. 2, the NiO 40 is dispersed throughout the ceramic body 31; however, it is only necessary to have the NiO near the outer surfaces of the ceramic body 31 in order to achieve the objects of the invention. The ceramic material preferably comprises about 0.5 to 30 weight percent of NiO. More preferably, there should be a minimum of 3 weight percent of NiO present.

The surface metallurgy 36, 38 comprises copper or gold. Normally, copper or gold will not adhere to ceramic materials. During the sintering according to the present invention, however, the copper or gold becomes an adherent layer of metallurgy.

The sintering cycle proceeds as before with the following qualifications. When the right temperature and oxidative conditions are present, the nickel oxide in the ceramic body will cause a bond to be formed between the surface layer of metallurgy and the ceramic body. Referring again to FIG. 3, above the Ni/NiO equilibrium line (line 4) for unalloyed nickel are the equilibrium lines for nickel in a copper/nickel alloy (lines 2 and 3). Shown are the lines for copper/nickel alloys containing 5 and 10 atom percent nickel. The particular alloy that is formed is a function of the amount of NiO in the ceramic body and the oxygen partial pressure. During binder burnoff, it is necessary to have the partial pressure of oxygen below that for the oxidation of copper. At this point in the sintering cycle, an interfacial reaction will occur between the ceramic material and the surface metallurgy. The NiO in the ceramic material will reduce to nickel and form an alloy with the surface metallurgy. Thus, this second aspect of the invention is the reverse of the first aspect of the invention. Again, the alloy that is formed will be a function of the amount of NiO in the ceramic body and the oxygen partial pressure. As shown in FIG. 3, this alloy will be a copper/nickel alloy but gold/nickel alloys will form in a similar way. The particular equilibrium line chosen will dictate how much nickel in the alloy is formed.

If desired, a drying step may be inserted after binder burnoff.

Then, during densification and crystallization, the partial pressure of oxygen should be set just below the Ni/NiO equilibrium line for nickel in copper and for the particular copper/nickel alloy.

The objects and advantages of the present invention will become more apparent after referring to the following examples.

EXAMPLES

Examples I

A series of samples were prepared to demonstrate the bonding of nickel pads to a glass ceramic substrate.

Cordierite glass ceramic (having about 20 weight percent MgO) substrates were prepared by the conventional tape casting method as discussed previously. Prior to sintering, nickel pads (60 mil diameter) were screened onto the substrate. The nickel paste consisted, in weight percent, of 83% nickel and 17% organics comprising ethyl cellulose binder, solvent, surfactant and rheological modifier.

The substrates were then sintered according to the following sintering cycle. After binder pyrolysis in nitrogen, the remainder of the sintering cycle took place with an ambient consisting of 1% $H_2$ in steam. Binder burnoff took place at 785 degrees Centigrade and densification and crystallization were at 975 degrees Centigrade, followed by cool down to room temperature.

Thereafter, pins were soldered to the pads to test the adhesion of the pads to the substrates. Six groups of samples were tested to failure with the following results:

| Group No. | Average pull strength, lbs. |
| --- | --- |
| 1 | 15.2 |
| 2 | 7.8 |
| 3 | 15.3 |
| 4 | 12.5 |
| 5 | 11.3 |
| 6 | 11.1 |

Average pull strength greater than 5 pounds is considered to be acceptable. The results, therefore, indicate good adhesion of the nickel pads to the glass ceramic substrates.

Examples II

Seven substrates were prepared to demonstrate the bonding of copper/nickel pads to a cordierite glass ceramic (about 20 weight percent MgO) substrate.

As in Examples I, cordierite glass ceramic substrates were prepared but, in these examples, a copper/nickel paste was screened onto the substrates to form pads. The paste consisted, in weight percent, of 70.6% copper, 8.3% nickel, 4.1% glass frit, remainder ethyl cellulose binder, solvent, surfactant and rheological modifier. Based on the solids content alone, the paste consisted, in weight percent, of 85% copper, 10% nickel and 5% glass frit.

The substrates were sintered as in Examples I except that the sintering atmosphere was more oxidative, containing only 1000 ppm (0.1%) $H_2$ in steam.

Pins were then soldered to the pads for the pull test. Average pin-pull strengths ranged from 16.2 to 18.5 pounds, thereby indicating good adhesion of the pads to the substrate.

Examples III

In order to demonstrate the second aspect of the invention, glass ceramic substrates were prepared having the following composition, in weight percent: 51% cordierite glass ceramic (having about 20 weight percent MgO), 5% NiO and 44% organics (polyvinyl butyral binder, solvents, plasticizers, etc.). The substrates were prepared by the conventional tape casting method. Thereafter, copper pads were screened on the substrate with a paste comprising, in weight percent, 83% copper and 17% organics.

The substrates were then sintered as indicated in the previous examples. The atmosphere during binder burnoff was 100 ppm $H_2$ in steam, followed by drying in nitrogen. Then, the atmosphere was switched back to steam with the atmosphere set just below the equilibrium Ni/NiO line (line 3) for nickel (10 atom percent) in copper. This corresponded to about 1000 ppm (0.1%) $H_2$ in steam.

Pins were then soldered to the pads to test their adhesion to the substrates. All the substrates exhibited average pin pull results of greater than 20 pounds, thereby further demonstrating the effectiveness of the present invention.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of forming an adherent layer of metallurgy on a ceramic substrate comprising the steps of:
 obtaining a green ceramic body comprising a ceramic material containing at least 5 weight percent of MgO, a polymeric binder and copper metallurgy patterns within said ceramic body;
 forming a layer of nickel-containing metallurgy on said ceramic body;
 sintering said ceramic body through a sintering cycle comprising the steps of:
 (a) a pyrolysis segment to pyrolyze said polymeric binder;
 (b) a binder burnoff segment conducted at a first temperature and in a steam atmosphere wherein said atmosphere is sufficient to burn off said binder without oxidizing said copper metallurgy; and
 (c) a densification and, in some cases, crystallization segment conducted at a second temperature higher than said first temperature and in a steam atmosphere, said steam atmosphere selected to meet the following requirements:
 a partial pressure of oxygen less than that necessary to satisfy the equilibrium equation $4Cu+O_2=2Cu_2O$; and a partial pressure of oxygen less than that necessary to satisfy the equilibrium equation $2Ni+O_2=2NiO$.

2. The method of claim 1 wherein said nickel-containing metallurgy is nickel and the equilibrium equation $2Ni+O_2=2NiO$ is for pure nickel.

3. The method of claim 1 wherein said nickel-containing metallurgy is an alloy containing nickel.

4. The method of claim 3 wherein said alloy is a copper/nickel alloy with the nickel being present in an amount of 1–10 atom percent and the equilibrium equation $2Ni+O_2=2NiO$ is for nickel in said copper/nickel alloy.

5. The method of claim 3 wherein said alloy is a gold/nickel alloy with the nickel being present in an amount of 1–10 atom percent and the equilibrium equation $2Ni+O_2=2NiO$ is for nickel in said gold/nickel alloy.

6. The method of claim 1 wherein said step of forming comprises screening a nickel-containing paste onto said ceramic body.

7. The method of claim 1 wherein said ceramic material comprises cordierite.

8. The method of claim 1 wherein said first temperature is in the range of 690 to 850 degrees Centigrade.

9. The method of claim 1 wherein said second temperature is in the range of 900 to 1000 degrees Centigrade.

10. The method of claim 1 wherein said ceramic body further comprises internal wiring patterns and vias of copper or gold.

11. The method of claim 1 wherein said nickel-containing metallurgy is nickel oxide.

12. The method of claim 1 further comprising the step after binder burnoff and before densification and crystallization of changing the atmosphere from steam to an atmosphere of nitrogen or forming gas.

13. The method of claim 1 wherein binder burnoff is conducted at a temperature above that necessary to satisfy the equation $2Ni+O_2=2NiO$.

14. The method of claim 1 wherein binder burnoff is conducted at a temperature less than that necessary to satisfy the equation $2Ni+O_2=2NiO$.

15. A method of forming an adherent layer of metallurgy on a ceramic substrate comprising the steps of:
 obtaining a green ceramic body comprising a ceramic material containing NiO, a polymeric binder and copper metallurgy patterns within said ceramic body;
 forming a layer of surface metallurgy on said ceramic body, said surface metallurgy selected from the group consisting of copper and gold;
 sintering said ceramic body through a sintering cycle comprising the steps of:
 (a) a pyrolysis segment to pyrolyze said polymeric binder;
 (b) a binder burnoff segment conducted at a first temperature and in a steam atmosphere wherein said atmosphere is sufficient to burn off said binder without oxidizing said copper metallurgy patterns; and
 (c) a densification and, in some cases, crystallization segment conducted at a second temperature higher than said first temperature and in a steam atmosphere, said steam atmosphere selected to meet the following requirements:
 a partial pressure of oxygen less than that necessary to satisfy the equilibrium equation $4Cu+O_2=2Cu_2O$; and a partial pressure of oxygen less than that necessary to satisfy the equilibrium equation $2Ni+O_2=2NiO$ for nickel in said surface metallurgy.

16. The method of claim 15 wherein said ceramic material contains 0.5 to 30 weight percent NiO.

17. The method of claim 16 wherein at least 3 atom percent NiO is present.

18. The method of claim 16 wherein said surface metallurgy is copper and said NiO in said ceramic body forms an alloy with said copper, said alloy having 1–10 atom percent nickel, remainder copper.

19. The method of claim 16 wherein said surface metallurgy is gold and said NiO in said ceramic body forms an alloy with said gold, said alloy having 1–10 atom percent nickel, remainder gold.

20. The method of claim 15 wherein said ceramic material comprises cordierite.

21. The method of claim 15 wherein said first temperature is in the range of 690 to 850 degrees Centigrade.

22. The method of claim 15 wherein said second temperature is in the range of 900 to 1000 degrees Centigrade.

23. The method of claim 15 wherein said ceramic body further comprises internal wiring patterns and vias of copper or gold.

24. The method of claim 15 further comprising the step after binder burnoff and before densification and crystallization of changing the atmosphere from steam to an atmosphere of nitrogen or forming gas.

25. The method of claim 15 wherein the step of binder burnoff is conducted at a partial pressure in the range from a partial pressure of oxygen less than that necessary to satisfy the equilibrium equation $4Cu+O_2=2Cu_2O$ to a partial pressure less than that necessary to satisfy the equilibrium equation $2Ni+O_2=2NiO$ for nickel in said surface metallurgy.

* * * * *